United States Patent [19]
O'Mahony et al.

[11] Patent Number: 5,111,153
[45] Date of Patent: May 5, 1992

[54] NON-LINEAR OPTICAL AMPLIFICATION

[75] Inventors: Michael J. O'Mahony, Felixstowe; Ian W. Marshall, Woodbridge, both of England

[73] Assignee: British Telecommunications public limited company, England

[21] Appl. No.: 540,444

[22] Filed: Jun. 18, 1990

Related U.S. Application Data

[63] Continuation of Ser. No. 341,323, Apr. 21, 1989, abandoned.

[30] Foreign Application Priority Data

Apr. 22, 1988 [GB] United Kingdom ................. 8809603

[51] Int. Cl.$^5$ ......................... H01S 3/103; G02F 1/28
[52] U.S. Cl. ................................... 359/336; 377/102; 372/21; 359/345
[58] Field of Search ......................... 330/4.3; 377/102; 372/8, 21

[56] References Cited

U.S. PATENT DOCUMENTS

| | | | |
|---|---|---|---|
| 4,074,361 | 2/1978 | Claw | 330/4.3 |
| 4,518,934 | 5/1985 | Venkateser | 372/21 |
| 4,772,854 | 9/1988 | Silberberg | 330/4.3 |

FOREIGN PATENT DOCUMENTS

| | | |
|---|---|---|
| 0264230 | 4/1988 | European Pat. Off. |
| 2197749 | 5/1988 | United Kingdom |
| 8802133 | 3/1988 | World Int. Prop. O. |

OTHER PUBLICATIONS

Adams et al., "A Comparison of Active . . . Semiconductors", IEEE JQE, vol. QE-21, #9, pp. 1498–1504, Sep. 1985 abst only provided.

Westlake et al., "Optical Bistablity in . . . Speed", Bus. Center Acad. Soc. pp. 161–164, Conf. Paper, Aug. 22, 1986, abst. only.

Proceedings of the Topical Meeting, "Optical Bistability III", held at Tucson, Ariz., Dec. 2–4, 1983, Springer-Verlag, (1986).

Smith, "Optical Switching and Logic", Paper, pp. 184–186, Bell Communications Research, Inc., Holmdel, N.J. 07733.

Lasher, "Analysis of a Proposed Bistable Injection Laser", 7 Solid-State Electronics, pp. 707–716, IBM Watson Research Center, Yorktown Heights, N.Y., (received Mar. 20, 1964) Pergamon Press printed in Great Britain, (1964).

Nathan et al, "GaAs Injection Laser with Novel Mode Control and Switching Properties", 36 Journal of Applied Physics, No. 2, pp. 473–480, (Feb. 1965).

"Bistable Operation in Semiconductor Lasers with Inhomogeneous Excitation", 17 Electronics Letters, No. 4, pp. 167–168, (Feb. 19, 1981).

Harder et al., "Bistability and Pulsations in cw Semiconductor Lasers with a Controlled Amount of Saturable Absorption", 39 Appl. Phys. Lett. No. 5, pp. 382–384, 1981, American Institute of Physics, 0003-6951/81/170382-03$00.50 (Sep. 1, 1981).

(List continued on next page.)

Primary Examiner—Nelson Moskowitz
Attorney, Agent, or Firm—Nixon & Vanderhye

[57] ABSTRACT

An optical amplifier having a saturable absorption region is operated below the lasing threshold for the device. Non-linear effects and bistability are observable at temperatures above room temperature. A selected input wavelength $\lambda_i$ within the gain spectrum of the device is amplified and an output at the same wavelength $\lambda_i$ is produced. This is in contrast to the normal operation at threshold, where there is a wavelength shift to the lasing wavelength and, depending on the laser used for the naturable absorption device, the output may be multimode for a monomode input. Best gain is achieved by tuning the input wavelength to a peak of a Fabry-Perot mode in the gain spectrum for the amplifier.

The amplifier may be used as wavelength controlled optical switch, when operated bistably, or as a regenerative amplifier when operated in the non-linear region without hysteresis effects.

34 Claims, 6 Drawing Sheets

OTHER PUBLICATIONS

Kawaguchi, "Optical Input and Output Characteristics for Bistable Semiconductor Lasers", 41 *Appl. Phys. Lett.* No. 8, 1982 American Institute of Physics, 0003-6951/82/08072-03$01.00, (Oct. 15, 1982).

Basov, "O-1-Dynamics of Injection Lasers", QE-4 *IEEE Journal of Quantum Electronics*, No 11, pp. 855-864, (Nov. 1968).

M. J. O'Mahony, et al., "Gain Measurements on Laser Amplifiers for Optical Transmission System at 1.5 $\mu$m", British Telecom Technology Journal, vol. 3, No. 3, Jul. 1985, pp. 25-29.

R. C. Steele and I. W. Marshall, "100 Mbits/s PSK Heterodyne Experiment Using a Travelling-Wave Laser Amplifiers", Electronics Letters, vol. 23, No. 6, May 12, 1987, pp. 296-297.

M. J. Adams, H. J. Westlake and M. J. O'Mahony, "Optical Bistability in 1.55 $\mu$m Semiconductor Laser Amplifiers", pp. 173-176.

M. J. O'Mahony, "Optical Amplifiers and Their Applications", Phil. Trans. R. Society of London, 1989, pp. 143-152.

M. J. Adams, H. J. Westlake, M. J. O'Mahony and I. D. Henning, "A Comparison of Active and Passive Optical Bistability in Semiconductors", IEEE Journal of Quantum Electronics, vol. QE-21, No. 9, Sep. 1985, pp. 1498-1504.

M. J. O'Mahony, et al., "Wideband Optical Receivers Using Travelling Wave Amplifiers for Gbit/s Systems", GLOBECOM, 1987, pp. 833-836.

M. J. O'Mahony, et al., "Wideband 1.5 $\mu$m Optical Receiver Using Travelling-Wave Laser Amplifier", Electronics letters, vol. 22, No. 33, Nov. 6, 1986, pp. 1238-1240.

H. J. Westlake and M. J. O'Mahony, "Gain Characteristics of a 1.5 $\mu$m DCPBH InGaAsP Resonant Optical Amplifier", Electronics Letters, vol. 21, No. 1, Jan. 3, 1985, pp. 33-35.

M. J. O'Mahony et al., "Low-Reflective Semiconductor Laser Amplifier with 20 dB Fibre-to-Fibre Gain at 1500 nm", Electronics Letters, vol. 21, No. 11, May 23, 1985, pp. 501-502.

I. W. Marshall, M. J. O'Mahony and P. D. Constantine, "Optical System with Two Packaged 1.5 $\mu$m Semiconductor Laser Amplifier Repeaters", Electronics Letters, vol. 22, No. 5, Feb. 27, 1986, pp. 253-255.

H. J. Westlake, M. J. Adams and M. J. O'Mahony, "Assessment of Switching Speed of Optical Bistability in Semiconductor Laser Amplifier", Electronics Letters, vol. 22, No. 10, May 8, 1986, pp. 541-543.

H. J. Westlake, M. J. Adams, M. J. O'Mahony, "Measurement of Optical Bistability inan InGaAsP Laser Amplifier at 1.5 $\mu$m", Electronics Letters, vol. 21, No. 21, Oct. 10, 1985.

A. J. Lowery, I. W. Marshall, "Stabilization of Mode-Locked Pulses Using Travelling-Wave Semiconductor Laser Amplifier", Electronics Letters, vol. 26, No. 2, Jan. 18, 1990, pp. 104-106.

Hitoshi Kawaguchi, "Absorptive and Dispersive Bistability in Semiconductor Injection Lasers", Opatical and Quantum Electronics, vol. 19, 1987, pp. S1-S36.

M. J. O'Mahony et al., "Semiconductor Laser Amplifiers for Optical Communication Systems", British Telecom Technology, vol. 5, No. 3, Jul. 1987, pp. 9-18.

I. W. Marshall, M. J. O'Mahony, et al., "Gain Characteristics of a 1.5 $\mu$m Nonlinear Split Contact Laser Amplifier", Applied Physics Letters, vol. 53, No. 17, Oct. 24, 1988, pp. 1577-1579.

M. J. O'Mahony and R. G. Brockbank, "TUA5 Effects of Phase Noise in Injection-Locked Laser Amplifier Systems", Conference on Optical Fibre Communication, Digest of Technical Papers, pp. 36, Jan. 23, 1984-Jan. 25, 1984.

H. J. Westlake, M. J. Adams, M. J. O'Mahony, "Optical Bistablity in Semiconductor Laser Amplifiers—Assessment of Switching Speed", Extended Abstract of the 18th (1986 International) Conference on Solid State Devices and Materials, Tokyo, 1986, pp. 161-164.

M. J. O'Mahony, "Semiconductor Laser Optical Amplifiers for Use in the Future Fiber Systems", Journal of Lightwave Technology, vol. 6, No. 4, Apr. 1988, pp. 533-544.

H. J. Westlake, M. J. O'Mahony, "Bidirectional and Two-Channel Transmission System Measurements Using a Semiconductor-Laser-Amplifier Repeater", Electronics Letters, vol. 23, No. 12, Jun. 4, 1987, pp. 649-654.

(List continued on next page.)

OTHER PUBLICATIONS

I. W. Marshall and M. J. O'Mahony, "10 GHz Optical Receiver Using a Travelling-Wave Semiconductor Laser Amplifier", Electronics Letters, vol. 23, No. 20, Sep. 24, 1987, pp. 1052-1053.

I. W. Marshall, D. M. Spirit, M. J. O'Mahony, "Picosecond Pulse Response of a Traveling-Wave Semiconductor Laser Amplifier", Electronics Letters, vol. 23, No. 16, Jul. 30, 1987, pp. 818-819.

I. W. Marshall, M. J. O'Mahony, P. D. Constantine, "TWSLA Preamplifier Optical Receivers", Proceedings of the 14th European Conference on Optical Communication, Conference Publication No. 292, vol. 1, Sep. 15, 1988, pp. 483-586.

M. J. O'Mahony, "Semiconductor Laser Amplifiers as Repeaters", IOOC-EOC, 1985, pp. 39-53.

Optical and Quantum Electronics, vol. 19, Jul. 1987, Chapman and Hall Ltd., H. Kawaguchi: "Absorptive and Dispersive Bistability in Semiconductor Injection Lasers", pp. S1-S36.

Electronics Letters, vol. 23, No. 10, May 7, 1987, H. F. Liu et al: "Proposal of an Optical Triggering Scheme for Bistable Semiconductor Lasers: Combination with Photoconductors"—pp. 532-534.

Solid-State Electronics, vol. 30, No. 1, Jan. 1987, Pergamon Journals Ltd, (Oxford, GB), M. J. Adams: "Physics and Applications of Optical Bistability in Semiconductor Laser Amplifiers"—pp. 43-51.

NON-LINEAR OPTICAL AMPLIFICATION

This is a continuation of application Ser. No. 07/341,323, filed Apr. 21, 1989, now abandoned.

The present invention relates to optical amplification, in particular to absorptive non-linearity and bistability in laser diodes.

Absorptive bistable lasers are known, and they have been used for experimental purposes. In one such known device, an InGaAsP buried heterostructure laser diode has its upper contact layer split into two electrically isolated portions, and each portion can be differently biassed. One portion is subjected to a bias current sufficient to cause operation above the laser threshold, whilst the other is biassed so that little injection current flows. This second portion acts as a non-linear saturable absorber. It was found that, at suitable temperatures and with the first portion initially biassed at fractionally below threshold (e.g. 99% of threshold), optical or electrical pumping to above the lasing threshold causes non-linearity and bistability with, in some cases, large hysteresis effects. Relatively high bias currents, typically to far above threshold, are required. Details of practical work and theoretical calculations for absorptive bistability in semiconductor injection lasers have been published by a number of researchers. A useful review of the subject is given in J. Optical & Quantum Electronics, Vol. 19, (1987) 81-36, H. Kawaguchi.

In this specification, the term "non-linear" is used to refer to a device or its operation where there is, at some point, a jump in output for given operating conditions. "Bistability" is an enhanced non-linear effect (i.e. the non-linearity is more pronounced) where there is hysteresis. At the onset of bistability there is a region of instability, where there are small bistable effects and frequent switches in output may arise (self-pulsation) due to very small unintended operating or environment changes (e.g. temperature).

Absorptive bistable lasers can be made to lase by optical pumping to above threshold at any wavelength within the gain spectrum although of course optical pumping on a Fabry-Perot mode will be inefficient. Whatever pumping wavelength is chosen, lasing (with the laser resonating at the wavelength where the Q of the laser cavity is highest) occurs at the device's lasing wavelength (defined by the peak of the gain curve). Normal lasers have multiple longitudinal emission modes at several wavelengths, and hence will give a multimode output at the peak of the gain curve, and this is often a disadvantage. DFB lasers with absorptive regions have therefore been used to overcome this problem and provide single mode operation. DFB or other narrow band lasers tend to be expensive, which is a disadvantage.

The present invention provides a new and advantageous non-linear optical device and mode of operation.

First, it has been found that it is not necessary to initiate lasing (i.e. resonance) for non-linear effects to arise. Surprisingly, the same degree of non-linearity arises even below threshold; so the same proportional increase in output (i.e. level of bistability) can be achieved by operating the device as an amplifier rather than a laser. Typically, the amplifier may be both initially biassed and subsequently operated at about 10-20% below the threshold bias.

Furthermore, one is not limited to output at the lasing wavelength defined by the peak of the gain curve. For any input at a wavelength within the gain spectrum, an amplified output is obtained at the same wavelength. Thus, there is a wide choice of output wavelengths. Also, it is not necessary to use an expensive narrowband laser, such as a DFB laser, for the device with saturable absorber, since with this invention monomode output from the device is obtained whenever the input to the device is monomode. It has also been found that in those devices with significantly reflective facets lower switching energies are obtained by tuning the input wavelength to the peak of a Fabry-Perot mode in the gain spectrum for the device.

Thus, the present invention provides a method of amplifying an optical signal, comprising locating an optical amplifier device having an amplification region and a saturable absorption region so that an input optical signal is receivable by the amplification region, inputting said signal of selected wavelength $\lambda$ and at a level below the lasing threshold of the device, controlling the device to operate in a non-linear manner, and receiving an amplified output signal at the input wavelength $\lambda$.

The invention also provides an optical amplifier having a saturable absorption region, and adapted to operate non-linearly below threshold so that for an optical signal at wavelength $\lambda_i$ input to the device an output at wavelength $\lambda_i$ is generated.

For an understanding of the present invention and its significance, it is important that the differences between laser amplification and laser oscillation be well understood. Laser oscillation occurs in lasers, that is those devices in which a material with gain is positioned within an optical resonator, laser oscillation only taking place if there is a sufficiency of both gain and feedback. For any resonator construction, the lasing threshold ("threshold") defines the pumping limit above which laser oscillation will take place. Laser amplification occurs in devices where there is gain but where the combination of gain and feedback is sufficiently low for resonance not to occur. Consequently, a laser amplifier which has feedback may, if pumped hard enough (optically or electrically) start to oscillate and hence change from being an amplifier to being a laser. The change from amplifying operation to operation as a laser results from pumping above threshold. It is possible to pump both a laser oscillator ("laser") and a laser amplifier optically. The pump wavelength may in both cases have a wavelength which is shorter than the short wavelength limit of the gain spectrum. The pump wavelength may alternatively be within the gain curve, although if the pump wavelength coincides with a Fabry-Perot mode of the laser there will be little absorption and hence little if any pumping there will however be amplification.

An optical input (within the gain curve or with a shorter $\lambda$) can cause either one of two things to happen; it can either be absorbed or it can be amplified. If the optical input is absorbed, there is optical pumping and hence carriers will be excited. Excitation of carriers will increase spontaneous emission. As spontaneous emission rises the absorber will start to saturate. When the absorber has saturated, the device will resonate at the peak of the gain curve (that is, it will lase).

If the optical input is amplified, the carrier density is reduced, but the density of the photons is increased. Increasing the photon density incident on the absorber will eventually cause the absorber to saturate, and the output will switch. Hence, when amplifying, the device has switched output without the device being taken over threshold (and hence without lasing).

The invention will now be described, by way of example, with reference to the accompanying drawings in which.

Figure 1:
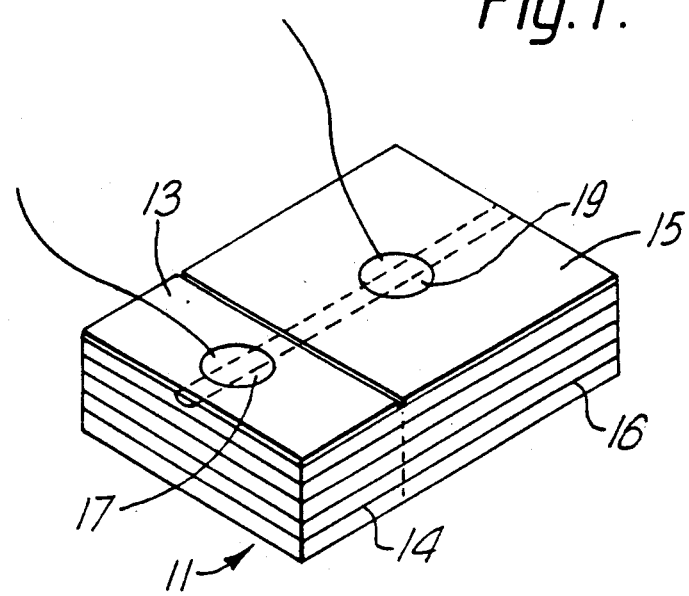
FIG. 1 is a view of an embodiment of a device according to the present invention.

Referring to FIG. 1, there is shown a long wavelength diode 11, which is an InGaAsP buried heterostructure laser diode, with active area dimensions of $0.15 \times 1.6 \times 400$ μm and a confinement factor of 0.3.

The device has an upper p contact layer which is split into two electrically isolated portions 13, 15 (associated with sections 14, 16 of the device) by a photolithographically controlled wet etching process. The separation between the two portions is 10 μm, giving a resistance between the two Au/Ti metallisation portions of typically about 450 Ohms. Portion 13 is 120 μm long and portion 15 is 270 μm long. The whole device is mounted on a Peltier cooler (not shown) and the temperature of the device is adjustable by varying the temperature of the cooler using a platinum resistor (not shown).

Respective gold bond pads 17, 19 are pressure bonded onto the Au/Ti metallisation on portions 13, 15, so that the two ends of the device can be differentially biassed.

Section 14 remains unbiassed during operation, and thus the active layer at this end of the device acts as a non-linear saturable absorber. The saturable absorption region absorbs radiation at the frequency at which it would, under different circumstances, emit. Only a finite amount of radiation is absorbed, and the region therefore saturates, thereafter providing no further absorption. Prior art publications, such as the article by Kawaguchi referred to above, explain in quantum mechanical terms how a fabricated device with one or more absorber regions acts when one contact portion is biassed at the threshold level and the other is unbiassed.

Figure 2:
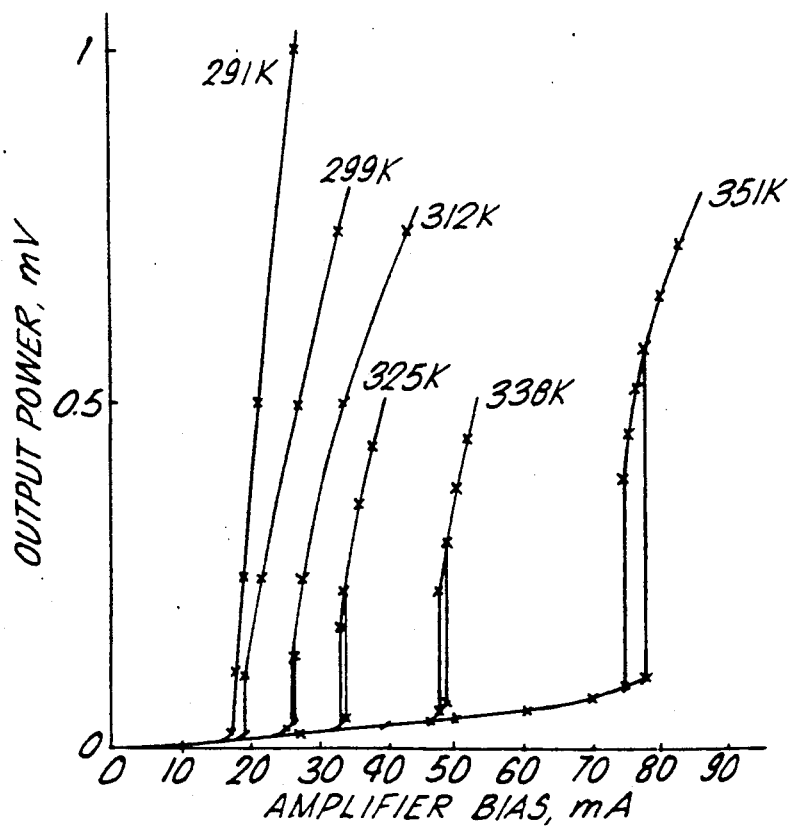
FIG. 2 is a graph of output power vs amplifier bias under various conditions, for the device of FIG. 1.

FIG. 2 is a graph showing this known mode of operation, and shows light current characteristics of a split element laser at various temperatures with absorber bias=OmA. Output power is plotted against amplifier bias current for a variety of temperatures of the Peltier cooler. Note that at 291 K., there is non-linear emission above the threshold (16 mA). At 299 K. there is an unstable region at threshold, and at 312 K. the first hysteresis effects are visible, with full hysteresis effects at 325 K. The bistability becomes more pronounced as temperature is increased further. At very much higher temperatures, non-linearity disappears, as gain falls with increasing temperatures, and absorption increases. It will be appreciated that optical, instead of electrical, power can be used for biassing. For example, it may be convenient to bias electrically to threshold, and use optical power for switching in the bistable (hysteresis) region. Control over the characteristics may be achieved by varying bias (optical or electrical or both) as well as (or instead of) temperature.

Figure 3:
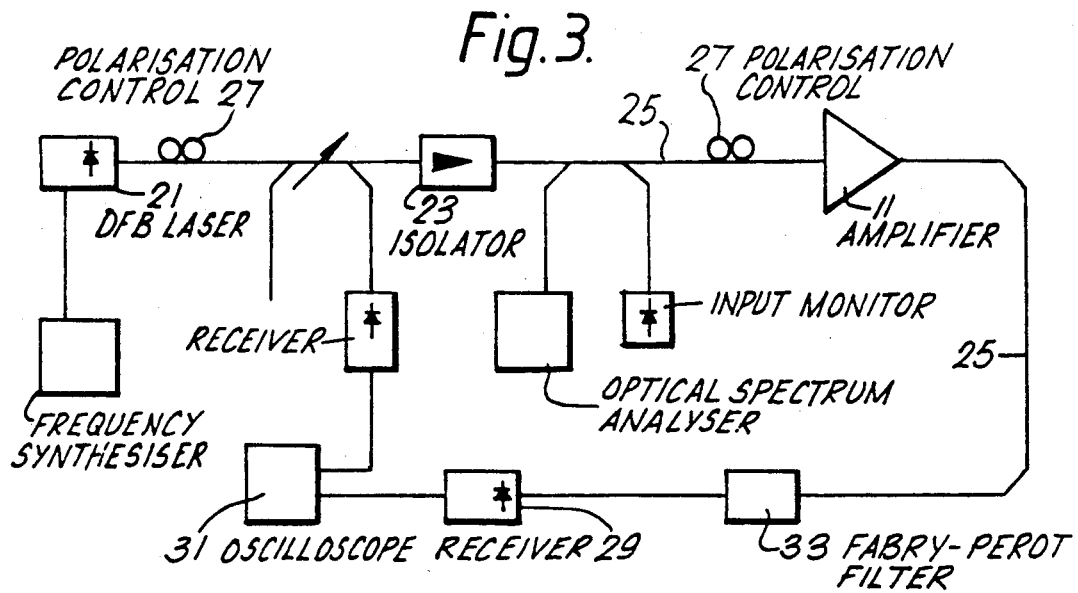
FIG. 3 is a sketch of an arrangement of components including the device of FIG. 1.
Figure 4:
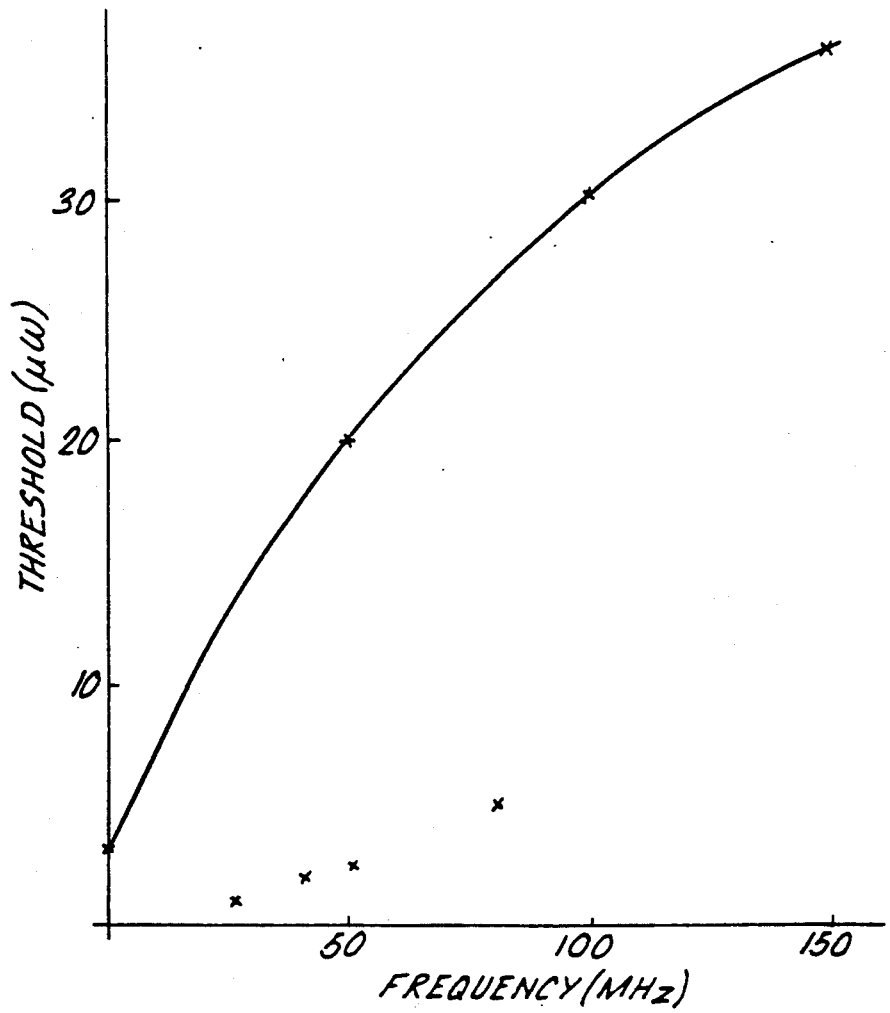
FIG. 4 is a graph of switching threshold vs frequency for bistable operation and FIG. 4(a) is a sample transfer characteristic of response of the laser as an amplifier.

We have discovered that the device can be biassed and operated below the lasing threshold, and that non-linearity and bistability are still observable even with a small forward bias on the absorber. Reverse biasing the absorber increases speed by decreasing the recovery time of the absorber. However, the amount of reverse bias which can be applied is limited by the resistance between the contacts associated with the portions 13 and 15, excessive reverse bias results in a surface leakage current across the gap between the electrodes. An arrangement of components used for operation according to one embodiment of the invention is illustrated in FIG. 3. The results of operation at a range of modulation frequencies are shown in FIG. 4. A sample transfer characteristic (10 MHz triangular input wave) is shown in the inset.

Referring to FIG. 3, a DFB laser 21 provides optical input at 1.556 μm. The input is tunable over 2 nm by adjusting the laser's operating temperature. Laser 21 is isolated from device 11 using a tailed Faraday rotation isolator 23, with an isolation of 35 dB. A tapered, lensed fibre 25 is used to couple light from laser 21 via a polarisation controller 27 to the TE mode in the amplifier section 16, which is biassed at a selected value (40 mA in this example) which is below threshold (45 mA). The output of unbiassed absorber section 14 is coupled via a second tapered, lensed fibre 25 to a detector 29. Detector 29, which is a 30 μm PIN photodiode with a bandwidth of 13.5 GHz, is connected via two amplifiers (not shown) to a sampling oscilloscope 31.

Figure 4A:
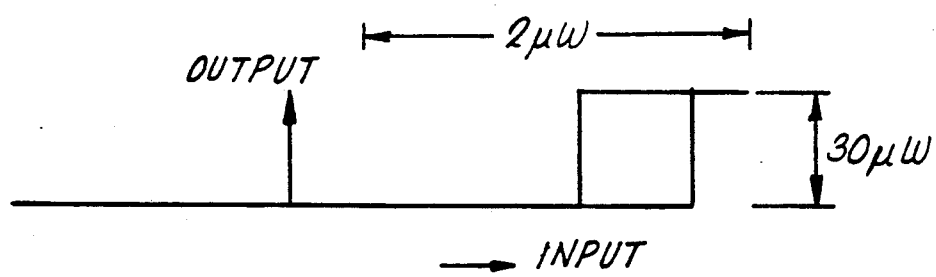

The response of device 11 to an optical input while biassed below threshold (45 mA) for a range of modulation frequencies is shown in FIG. 4. With the device operating bistably, at 335 K., the output of the device 11 switches from a low state of 8 μW to a high state of 35 μW at the input wavelength of 1.556 μm, with rise time of around 200 ps. The width of the hysteresis, that is, the difference in bias current between the top and bottom of the hysteresis step, was 1 mA. As a result, a sine wave input is converted into a square wave output. By locating a 1 nm band pass filter 33 tuned to the emission wavelength of laser 21 between device 11 and detector 29, the low state is reduced to 1 μW and the high state to 30 μW (an extinction ratio of 15 dB). A sample transfer characteristic (10 MHz triangular wave) is shown in FIG. 4(a).

The speed of switching of device 11 when operated as a bistable optical amplifier biassed well below threshold is limited by the recovery time of the absorber region. As explained above, reverse biasing the absorber region decreases the recovery time of the absorber. Maximum switch repetition rate is about 0.25 GHz.

With the absorber section 14 completely unbiassed the maximum switch repetition rate is limited to about 0.25 GHz. It has been discovered that by positively biassing the absorber region slightly, the width of the hysteresis decreases and, with bias of about 0.6 mA in the absorber region, the device loses its bistability and becomes simply non-linear. Another effect is that recovery time decreases. This is discussed in more detail below, when non-linear operation is described.

Figure 5:
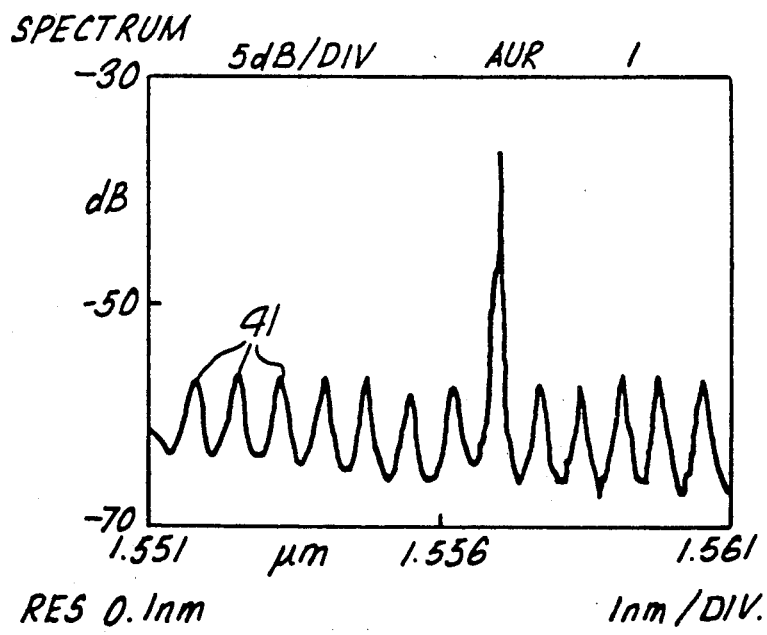
FIG. 5 is a spectrum at the output of the device of FIG. 1 when it is operating bistably.

As the device 11 has reflective facets, minimum switching power is achievable by tuning the input to the peak of one of the devices Fabry-Perot modes. FIG. 5 is a mode spectrum for device 11 showing mode peaks 41 and troughs. By selecting a peak, improved gain and a lower switching threshold are obtainable. The response of device 11 depends on the modulation frequency, but by tuning to a peak of one of the Fabry-Perot modes, the best possible gain is achieved. With this particular device, an output power of about 36 $\mu$W was achieved, while the minimum power required to change state was 2 $\mu$W and at the maximum repetition frequency of 150 MHz the threshold for repeated state changes was 36 $\mu$W (note these are not pulse energies). Thus the net gain of the amplifier varied between 0 and 12 dB for bistable operation (unsaturated gain). The gain is much lower and the switching threshold much higher than for a device operated above the lasing threshold, but the extinction ratio is unchanged.

If the bias current is reduced from 40 mA, but the temperature maintained at 335 K., (threshold is 45 mA), the hysteresis is reduced and the switching threshold increases. With a bias current of 25 mA, the switching threshold was 100 $\mu$W; 100 $\mu$W was the maximum power obtainable from the input laser 21 and hence it was not possible to determine switching thresholds for lower bias currents.

The input wavelength from the input laser 21 may be any suitable wavelength compatible with device 11. For this particular device, the range of possible wavelengths is around 30 nm, centered at the lasing wavelength, 1.57 $\mu$m. Typically, the range is 30-50 nm centered on the lasing wavelength. One important feature of the device operated below the threshold is that the incident light is amplified, so the output light has the same wavelength (or spread of wavelengths) as the input. With a DFB laser input, a useful single mode output is obtainable.

In contrast, if operated above threshold, the device operates as a wavelength shifter, and the output is always at the lasing wavelength (and will be multi-mode even with input light from a DFB laser, if device 11 is constructed as a multi-mode laser).

Figure 6:
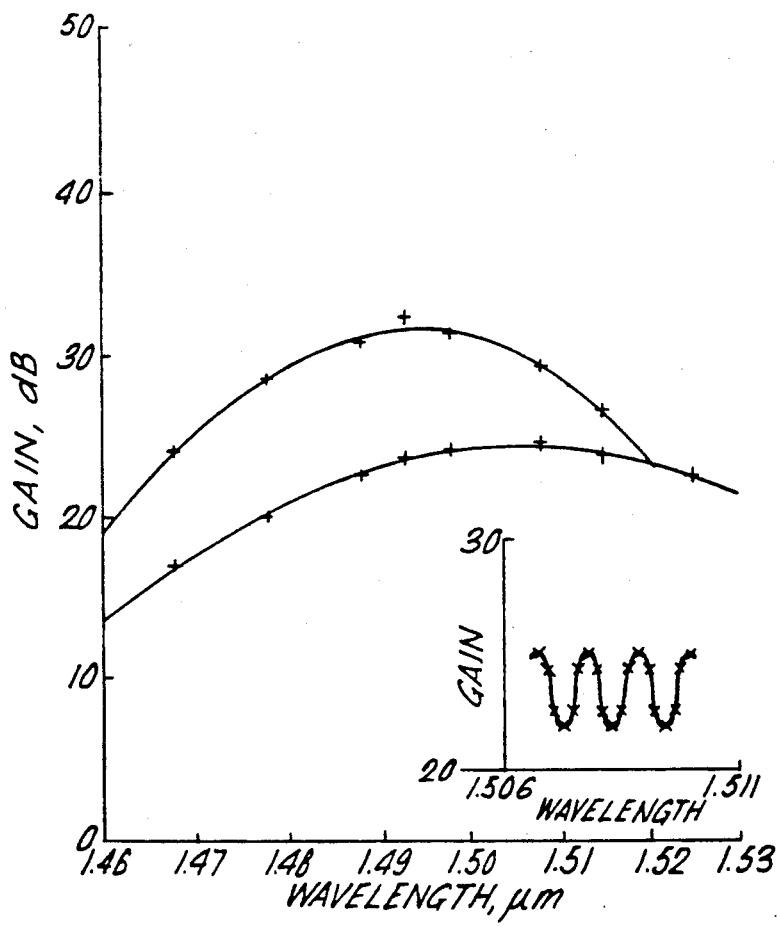
FIG. 6 is a typical gain versus wavelength spectrum for a device of the type shown in FIG. 1.

FIG. 6 shows gain versus wavelength for a device having a length of 500$\mu$, reflectivities of 0.08%, and input power of 40 dBm. In FIG. 6, the top curve represents 95% threshold, the bottom curve represents 70% threshold, and the smaller plot inset into the larger one represents ripple at 70% threshold.

As illustrated in FIG. 6, for a device with facet reflectivities of 0.08%, at well below threshold (70% of threshold), the gain spectrum is relatively flat with only a small amount (3 dB) of residual ripple, so a wide range of wavelengths may be amplified and tuning is relatively easy. At higher bias (95%) of spectrum is more peaked (about 10 dB here), its 3 dB width is narrower, and the mode bandwidth is reduced. This trend applied to all laser amplifiers regardless of the reflectivity of their facets, and the optimum operating point is always a compromise between the available gain and the required bandwidth. For an input signal to be amplified, the bandwidth of the input signal must be less than the bandwidth of the Fabry-Perot peaks. Additionally, the variability of the centre frequency of the input signal combined with the input signal bandwidth must be less than the width of the Fabry-Perot modes. Hence if the Fabry-Perot modes are narrow, one needs to control the centre frequency of the input signal and there is a limit on the transmission bandwidth. The best trade-off for most purposes is obtained at about 70% of threshold, where the gain is reasonable, the range of wavelengths which may be amplified is acceptably wide, and tuning is easy.

As explained above, the input wavelength needs to be tuned, for best gain, to a peak of the mode spectrum for device 11. This may be achieved by tuning the source with a grating for example, or by varying its temperature by adjusting the temperature of the Peltier cooler. Well below the device threshold, the mode peaks are broader, with lower peak to trough ratios, so less accurate control is needed to tune to a mode peak.

Figure 7A:
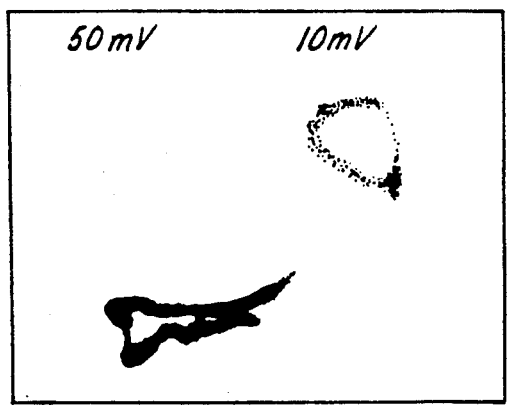
FIG. 7a is a transfer characteristic obtainable when the device of FIG. 1 is operated non-linearly to provide non-linear optical amplification.
Figure 7B:
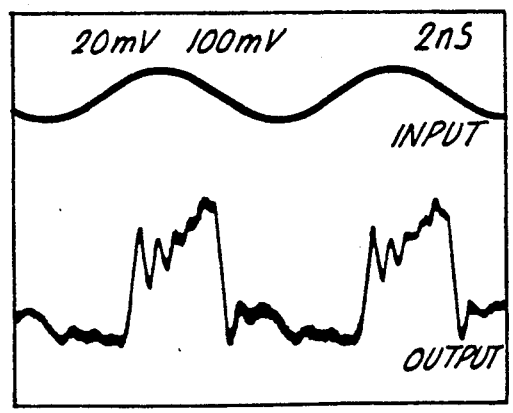
FIG. 7B is a pulse shaping effect obtainable when the device of FIG. 11 is operated non-linear to provide non-linear optical amplification.

The operation of the device 11 is in the bistable region has been described above. Operation at lower temperatures, in the region of non-linearity only without hysteresis effects (referred to here as simple non-linearity), will now be described. One application for the device 11 operated below threshold in the simple non-linear regime is for reshaping and amplifying of pulses. One example of the pulse shaping effect obtainable is shown in FIG. 7(b). The transfer characteristic is shown in FIG. 7(a). The sinusoidal input pulse is shown in the upper part of FIG. 7(b) and the reshaped square wave output is shown below. The precise shape of the output can be varied by altering the temperature or bias of the absorber section 14—raising the bias to decrease the absorption or raising the temperature to increase absorption (but not so high as to introduce bistable effects).

Thus, in the simple non-linear regime, the device is useful as a regenerative amplifier. Other applications of the device are as an optical limiter, as a pulse compressor, and as a low noise amplifier.

It has been explained above that by biassing the absorber region when the device is operating in the bistable regime, the device loses its bistability. One example of the use of the devices of FIG. 1 with a biassed absorber region will now be given. The amplifier 11 is operated at 18° C. with 16 mA in the amplifier region 16 and 0.6 mA bias in the absorber section 14. The optical transmitter 21, as before, is a DFB laser, aligned with a peak of the gain curve of amplifier 11. Other circuit details are as before.

Figure 8:
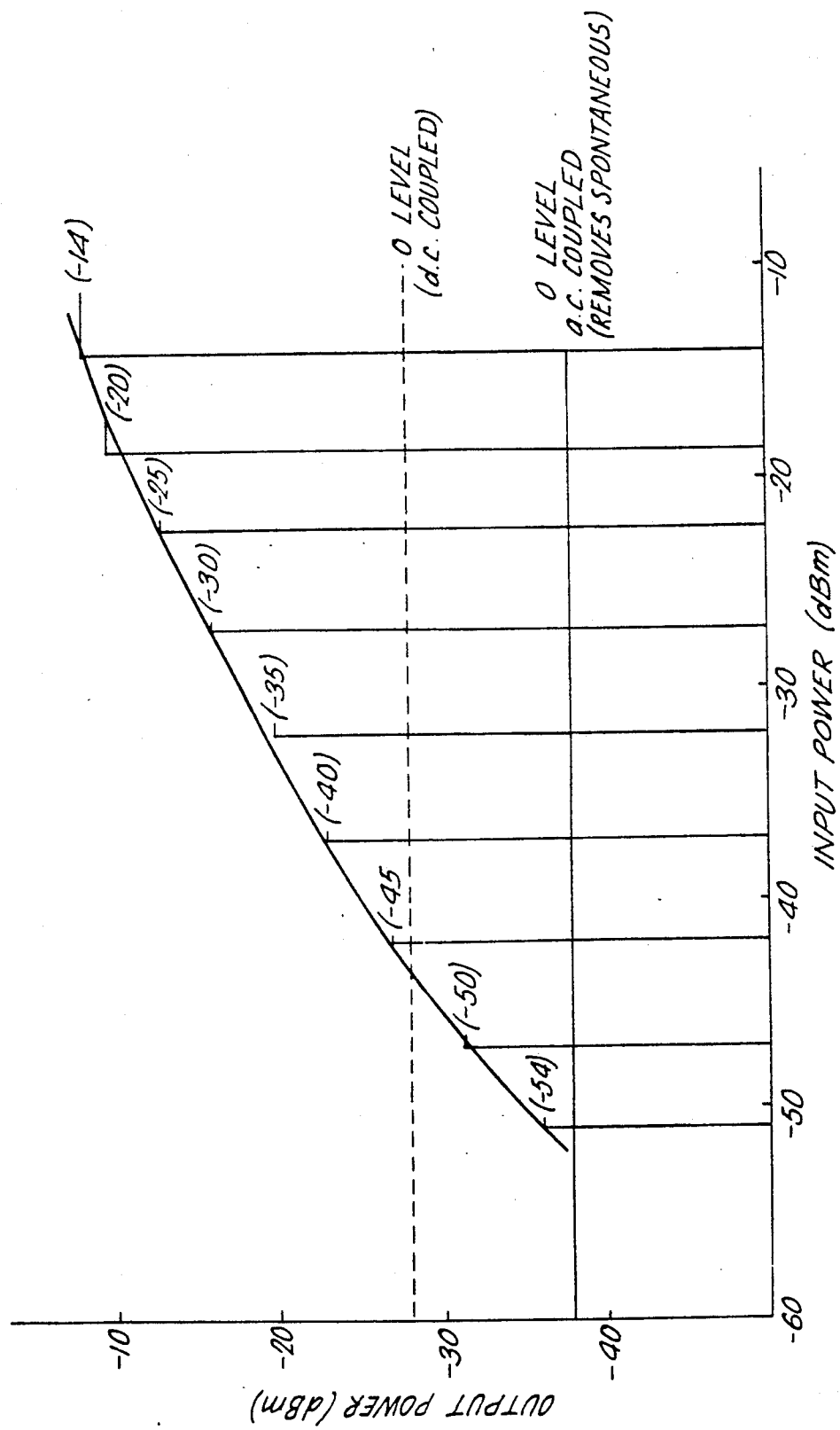
FIG. 8 shows transfer characteristics for a range of input powers for the device of FIG. 1 operated non-linearly when the absorber region is biassed.

A sample transfer characteristic of the device 11 for a triangular wave input is shown in FIG. 8 (power dependency of non-linear transfer characteristic mean power is shown in parenthesis). This characteristic is strongly non-linear (but not bistable) and the non-linearity has a detector limited risetime of 200 ps. The maximum repetition rate is 1–4 GHz for non-linear operation, compared to 0.25 GHz maximum switching rate with bistable operation. The non-linearity is dependent on the optical gain and is thus dependent on the detuning between the input wavelength and the Fabry-Perot modes of device 11. In general, detuning the input to shorter wavelengths results in a reduction in gain and a reduction in the optical output power, as already explained. The minimum input power required for non-linear gain was −51 dBm and the minimum input power for a contrast ratio of 10 dB was −30 dBm. The maximum input modulation frequency at which pulse shaping occurred was 700 MHz, corresponding to a minimum repetition time of 700 ps.

Figure 9:
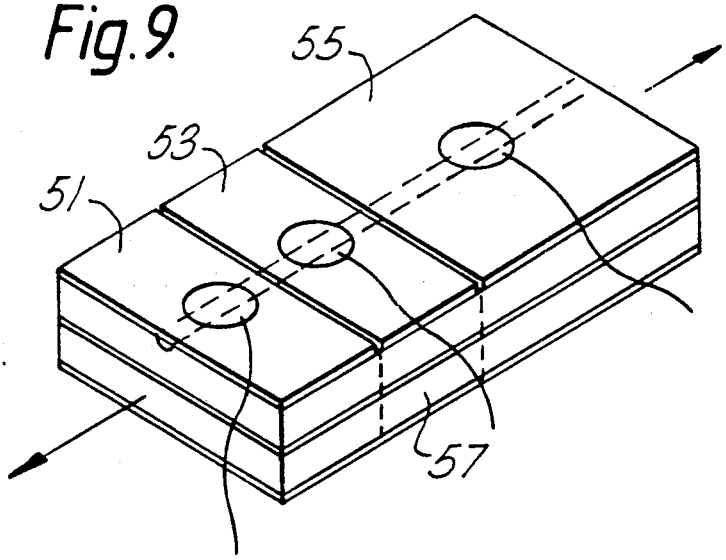
FIGS. 9 and 10 show further examples of device structures.
Figure 10:
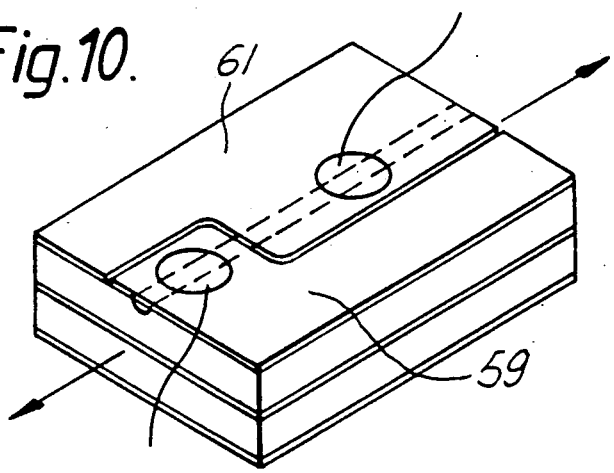

FIGS. 9 and 10 show alternative device structures. In the FIG. 9 embodiment, there are three electrode portions 51, 53 and 55. Portions 51 and 55 are biassed at several mA, but below the device threshold, and portion 53 is zero biassed, or biassed to a small extent, for example at below 1 mA, thereby creating a saturable absorber section 57. Portions 51, 53 may be differentially biassed for additional control.

The device structure shown in FIG. 10, in which the amplification region and the absorption region are defined by a "zig-zag" gap there between, is particularly advantageous. With such a structure, the length and/or area available for mounting a bonding pad for the absorption region is/are increased. Since the absorption region is short, possibly as short as 15 $\mu$m, conventional arrangements are difficult to bond to. Of course, it is not essential that the gap between the contact layers of the two regions crosses the active layer waveguide perpendicularly as shown, but the arrangement shown is particularly convenient.

Figure 11:
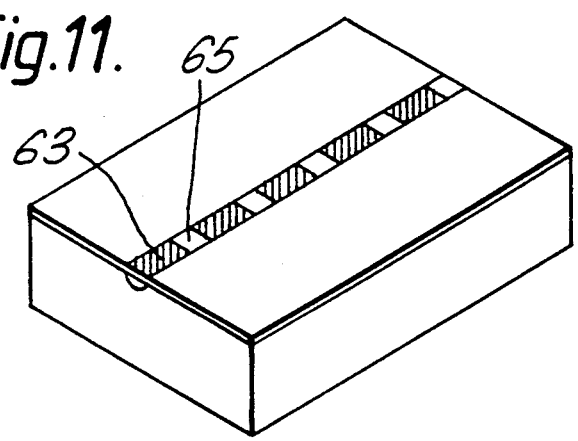

As many electrode portions as desired may be provided—in fact the absorber and amplifier regions may be distributed along the length of the device alternately, in a stripe pattern, as shown schematically in FIG. 11. We have found that while such structures can be used according to the invention, their performance is generally worse than that of the simple devices such as that described with reference to FIG. 1. In particular, we have found that devices with distributed absorption and amplifier regions have higher thresholds and lower switching speeds than those of FIG. 1 type devices. If such "distributed" devices are fabricated the amplifier regions 63 may be about twice as long as absorption regions 65. The absorption regions may be doped so that they cannot be biassed, whilst the amplifier regions can be biassed—for example zinc may be diffused into these regions to provide conductivity.

The ratio of absorption region to amplifying region may be selected depending on the desired characteristics, as may the total length of the device. For InGaAsP, device length may conveniently be in the range 200–500 $\mu$m for uncoated devices (reflectivity typically 30%). The absorption region is generally noticeably shorter than the amplifier region—say in the ratio 2:3 to 1:3. An unduly long absorption region (or long total length if there is distributed absorption) would restrict the non-linearity—if the absorption exceeds the gain in the amplifying region, the absorber does not saturate and non-linear effects are not seen.

The spacing between differently biassed regions needs to be chosen with some care. In the FIG. 1 example, the spacing was about 10 $\mu$m and the intercontact resistance 400 Ohms. If the resistance is too low, then the non-linear properties are lost, as bias leaks into the absorber, and absorption is reduced. On the other hand, if the gap is too big, loss is introduced between the two regions as the result of waveguide loss from the exposed active layer, effectively reducing the gain.

As mentioned above, the reflectivities of the two ends of the device are conveniently, if uncoated, about 30% (a typical laser reflectivity). These are advantages in reducing the reflectivities of the device facets. In general, as one reduces the facet reflectivities the transmission bandwidth increases, the amount of hysteresis reduces and the maximum switching rate increases. However, within these general rates, we have found that the amount of hysteresis falls with falling facet reflectivities, and that 3% reflectivity appears to be a limiting value below which there is simple non-linearity and no hysteresis. Also, while the maximum switching rate increases with falling facet reflectivities, there appears to be a limit about 0.5%, below which the maximum switching rate is constant.

When operated as a switch, the switch rise time is also dependent on facet reflectivity. With reflectivities below about 0.1%, the rise time is determined by the length of the absorber zone. With an absorber length of about 120 $\mu$m, and facet reflectivities below 0.1%, the rise time is about 2 ps, while for higher reflectivity facets the rise time is slower.

Repetition time is a function of the rise time and the fall time, the fall time being limiting. Fall time has two components: one, as in rise time, is a change in photon density; the other is recovery time of the absorber. As facet reflectivity falls, a shorter absorber is needed for the same degree of absorption. Photon lifetime falls as reflectivity falls, and hence changes in photon density are quicker and hence rise time and fall time both decrease. The use of a shorter absorber also results in shorter recovery times.

Pulse compression can also be achieved with devices operated according to the present invention, the minimum output pulse width which can be achieved depending on the facet reflectivities. The Minimum achievable pulse width depends upon the photon lifetime in the device and upon the bandwidth of the gain within the device. In general, reducing the facet reflectivities also reduces the minimum achievable pulse width, although the relationship is not simply linear. For low reflectivities, that is about 1%, the photon lifetime is the limiting factor in determining minimum pulse width. For example, with a facet reflectivity of 0.5%, the device of FIG. 1 would have a photon lifetime of about 7 ps and the minimum achievable pulse length would be about 10 ps. Such a device, receiving an input optical pulse of lengths 20 ps, would output an optical pulse of only 10 ps. As facet reflectivity is increased, for an otherwise fixed system the photon lifetime increases.

For reflectivities above about 1%, the gain bandwidth becomes an increasingly important factor. With uncoated facets having a minimum pulse duration of about 100 ps. With 3% reflectivity the FIG. 1 device would have a minimum pulse duration of about 20 ps.

One major advantage of operating devices as described below threshold is the good wavelength control over the output—essentially the output has the same wavelength or range of wavelengths as the input. The input wavelength may be any selected wavelength within the gain curve. This overcomes one of the major disadvantages of devices operated above threshold where a selected wavelength within a permissible range could be input, but for any given device, only a single output is possible at the lasing wavelength. This output, for most current lasers, is multimode, although DFB devices may enable monomode output to be achieved. The present invention avoids such difficulties, as only a narrow band source (such as DFB laser 21) is required for a narrow band output.

A further significant advantage of devices operating according to the present invention is that they can be used for low noise amplification. Since the devices have a low (essentially zero) output when there is no optical input, only switching on when there is an optical input, in the absence of an optical input, there is, unlike the situation with conventional laser amplifiers, no output due to spontaneous emission in the amplifier. This is of a particular advantage where the amplifier is being used to boost the output of a transmitter, because is usefully reduces the degradation of signal to noise ratio at the front end of a system.

Reducing the reflectivity of the output facet without similarly reducing the reflectivity of the input facet will tend to increase the output contrast ratio.

Reducing the reflectivity of the input facet is useful in maintaining bistability over a wide range of input signal bandwidths.

Various useful effects are realisable with devices in which the input facets and the output facets have different reflectivities.

We claim:

1. A method of amplifying an optical signal, comprising:
   locating an optical amplifier device having an amplification region and a saturable absorption region, there being either only one amplification region or only one saturable absorption region, so that an input optical signal is receivable by the amplification region,
   pumping the amplification region below the lasing threshold,
   inputting said signal of selected wavelength λ and at a level such that the amplification region remains below its lasing threshold,
   controlling the device to operate in a non-linear manner, and
   receiving an amplified output signal at the input wavelength λ.

2. A method of amplifying an optical signal, the method comprising the steps of:
   locating an optical amplifier device having an amplification region and a saturable absorption region, there being either only one amplification region or only one saturable absorption region, so that the optical input signal is receivable by the amplification region;
   pumping the amplification region to below the lasing threshold of the device;
   inputting said optical signal of selected wavelength λ, the input optical signal being at a wavelength and at a level such that laser oscillation is avoided, the input optical signal impinging of said saturable absorption region via said amplification region;
   controlling the device to operate in a non-linear manner; and
   receiving via said absorption region an amplified output at the input wavelength λ.

3. A method as in claim 1 or 2, wherein the input optical signal is tuned to a peak of a Fabry-Perot mode in the gain spectrum for the device.

4. A method as in claim 1 or 2 wherein the device comprises an input facet through which the optical signal is input into said amplification region, the device including means to reduce the reflectivity of that facet.

5. A method as claimed in claim 4 wherein said input facet reflectivity is 20% or less.

6. A method as claimed in claim 5 wherein said input facet reflectivity is 10% or less.

7. A method as claimed in claim 6 wherein said input facet reflectivity is 3% or less.

8. A method as claimed in claim 7 wherein said input facet reflectivity is 1% or less.

9. A method as in claim 1 or 2 wherein an output facet is provided for the outputting of said amplified output, the device including means to reduce the reflectivity of the output facet.

10. A method as claimed in claim 9 where the reflectivity of said output facet is 20% or less.

11. A method as claimed in claim 10 where the reflectivity of said output facet is 10% or less.

12. A method as claimed in claim 11 where the reflectivity of said output facet is 3% or less.

13. A method as claimed in claim 12 where the reflectivity of said output facet is 1% or less.

14. A method as in claim 4 wherein said input facet has substantially the same reflectivity as said output facet.

15. A method as in claim 4 wherein said input and output facets have substantially different reflectivities.

16. A method as in claim 1 or 2, wherein said controlling step comprises controlling the temperature of the device, and/or the bias of the amplifier region.

17. A method as in claim 1 or 2 including varying the input wavelength so as to control the output wavelength.

18. A method as in claim 1 or 2 further including controlling the device so as to operate bistably.

19. A method as in claim 1 or 2 where the device is controlled so as to operate non-linearly, but not bistably.

20. A wavelength controlled optical switch operated according to a method as claimed in any preceding claim, wherein the device is controlled so as to operate bistably.

21. A regenerative amplifier operated according to claim 19.

22. An optical amplifier of the type having a lasing threshold and partially reflective facets, the amplifier including a single saturable absorption region and being adapted to operate non-linearly below the lasing threshold so that for an optical signal at wavelength $\lambda_i$ input to the device an amplified output at wavelength $\lambda_i$ is generated.

23. An optical amplifier as claimed in claim 22, wherein a first electrode is provided for the biasing of an amplifying portion of the device, a second electrode is provided for the biasing of said saturable absorption region, and wherein the electrical resistance between said first and second electrodes is sufficiently high to enable said amplifying portion and said saturable absorption region to be differentially biassed with a substantially lower voltage applied to said second electrode than to said first electrode.

24. An optical amplifier according to claim 1 or 2, suitable for pulse compression.

25. An optical amplifier according to claim 1 or 2 suitable for low noise amplification.

26. A method as in claim 9 wherein said input facet has substantially the same reflectivity as said output facet.

27. A method as in claim 9 wherein said input and output facets have substantially different reflectivities.

28. An optical amplifier comprising:
   a buried heterostructure solid state diode having a light signal passage channel and having first and second electrodes spaced apart by at least approximately 10 μm longitudinally along and above said channel for applying different electrical bias currents to the diode at respectively located spaced-apart regions, thus defining a corresponding optical amplifier region under the first electrode and a saturable optical absorber region under the second electrode;

said diode having partially reflective facets of substantially less than 30% reflectivity located at opposite ends of said channel between which facets said first and second electrodes are sequentially disposed;

said first electrode being biassed to a first level sufficiently below the lasing threshold of said diode as to remain therebelow even when an input light signal pulse is received via one of said facets and causing the corresponding amplifier region of the diode to operate as a non-linear light amplifier;

said second electrode being conditioned to cause the saturable light absorber region to act as a saturable light absorber when receiving light signals output from said amplifier region just prior to outputting a processed light signal via the remaining one of said facets.

29. An optical amplifier as in claim 28 wherein said first electrode is at least approximately twice as long as said second electrode along said channel.

30. An optical amplifier as in claim 28 wherein there are no electrodes in addition to said first and second electrodes between said facets.

31. An optical amplifier as in claim 28 wherein said facets have reflectivities of substantially less than 10%.

32. An optical amplifier as in claim 31 wherein one facet has a substantially higher reflectivity than the other facet.

33. An optical amplifier as in claim 28 including means for controlling the wavelength of input light signals to correspond to a lasing mode of said diode if biassed above its lasing threshold.

34. An optical amplifier as in claim 28 wherein said electrodes are biassed to cause bistable optical outputs from said amplifier.

* * * * *